(12) United States Patent
Ryckaert et al.

(10) Patent No.: US 10,847,415 B2
(45) Date of Patent: Nov. 24, 2020

(54) SELF-ALIGNED GATE CONTACT

(71) Applicant: IMEC VZW, Leuven (BE)

(72) Inventors: Julien Ryckaert, Tervuren (BE); Juergen Boemmels, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/459,991

(22) Filed: Mar. 15, 2017

(65) Prior Publication Data
US 2017/0278752 A1 Sep. 28, 2017

(30) Foreign Application Priority Data
Mar. 15, 2016 (EP) ..................................... 16160325

(51) Int. Cl.
*H01L 27/088* (2006.01)
*H01L 21/768* (2006.01)
(Continued)

(52) U.S. Cl.
CPC .. *H01L 21/76897* (2013.01); *H01L 21/31144* (2013.01); *H01L 21/32133* (2013.01);
(Continued)

(58) Field of Classification Search
CPC ....... H01L 21/76897; H01L 21/823437; H01L 21/31144; H01L 21/823431;
(Continued)

(56) References Cited

U.S. PATENT DOCUMENTS

2012/0273848 A1* 11/2012 Fan ................ H01L 21/823418
257/288
2015/0054149 A1* 2/2015 Purushothaman ..........................
H01L 21/76898
257/737
(Continued)

OTHER PUBLICATIONS http://ieeexplore.ieee.org/document/8268472, published in 2017 IEEE International Electron Devices Meeting (IEDM), 11 pages.
(Continued)

*Primary Examiner* — Stephen M Bradley
*Assistant Examiner* — Wasiul Haider
(74) *Attorney, Agent, or Firm* — Knobbe, Martens, Olson & Bear, LLP

(57) ABSTRACT

The disclosed technology generally relates to semiconductor devices, and more specifically to electrical contacts to a transistor device, and a method of making such electrical contacts. In one aspect, a method of forming one or more self-aligned gate contacts in a semiconductor device includes providing a substrate having formed thereon at least one gate stack, where the gate stack includes a gate dielectric and a gate electrode formed over an active region in or on the substrate, and where the substrate further has formed thereon a spacer material coating lateral sides of the at least one gate stack. The method additionally includes selectively recessing the gate electrode of the at least one gate stack against the spacer material, thereby creating a first set of recess cavities. The method additionally includes filling the first set of recess cavities with a dielectric material gate cap.

(Continued)

The method additionally includes etching at least one via above the at least one gate stack and through the dielectric material gate cap, where etching the at least one via comprises selectively etching against the spacer material, thereby exposing the gate electrode. The method further includes forming, in the at least one via, a gate contact electrically connecting the gate electrode.

13 Claims, 8 Drawing Sheets

(51) Int. Cl.
    *H01L 21/311*     (2006.01)
    *H01L 21/3213*     (2006.01)
    *H01L 21/8234*     (2006.01)
    *H01L 23/522*     (2006.01)
    *H01L 23/528*     (2006.01)
    *H01L 29/66*     (2006.01)

(52) U.S. Cl.
    CPC .. *H01L 21/76802* (2013.01); *H01L 21/76807* (2013.01); *H01L 21/76877* (2013.01); *H01L 21/76895* (2013.01); *H01L 21/823431* (2013.01); *H01L 21/823437* (2013.01); *H01L 21/823475* (2013.01); *H01L 23/528* (2013.01); *H01L 23/5226* (2013.01); *H01L 27/0886* (2013.01); *H01L 29/66545* (2013.01); *H01L 21/76834* (2013.01)

(58) Field of Classification Search
CPC ......... H01L 21/76877; H01L 21/76802; H01L 21/823475; H01L 27/0886; H01L 23/5226; H01L 29/66545; H01L 23/528
See application file for complete search history.

(56) References Cited

U.S. PATENT DOCUMENTS

| | | | |
|---|---|---|---|
| 2016/0308016 A1* | 10/2016 | Choi | H01L 29/41791 |
| 2017/0054004 A1* | 2/2017 | Cheng | H01L 29/41791 |
| 2017/0186849 A1* | 6/2017 | Chen | H01L 29/6656 |
| 2017/0194211 A1* | 7/2017 | Lai | H01L 21/76897 |
| 2017/0294355 A1* | 10/2017 | Kim | H01L 21/823431 |

OTHER PUBLICATIONS

"Intel delays chip making changes" BBC News, https://www.bbc.com/news/technology-33549916, dated Jul. 16, 2016, 6 pages.

Auth et al., "A 10nm High Performance and Low-Power CMOS Technology Featuring 3$^{rd}$ Generation FinFET Transistors, Self-Aligned Quad Patterning, Contact over Active Gate and Cobalt Local Interconnects", 2017 IEEE International Electron Devices Meeting (IEDM), 4 pages.

Lammers, "Companies Ready Cobalt for MOL, Gate Fill", Semiconductor Manufacturing & Design Company, dated Dec. 21, 2017, 18 pages.

* cited by examiner

SELF-ALIGNED GATE CONTACT

CROSS-REFERENCE TO RELATED APPLICATIONS

This application claims foreign priority to European Patent Application No. 16160325.3, filed Mar. 15, 2016, the content of which is incorporated by reference herein in its entirety.

BACKGROUND

Field

The disclosed technology generally relates to semiconductor devices and more specifically to electrical contacts to a transistor device, and a method of making such electrical contacts.

Description of the Related Technology

Fabrication processes for semiconductor circuits including devices such as transistors, e.g., the back-end-of-line BEOL stage of fabrication processes, include forming gate contacts to transistors for electrically connecting the transistors gates to their corresponding contact lines. In some process architectures, unlike source and drain contacts, a lateral area footprint of the channels of transistors available for landing the gate contacts can be very limited. Furthermore, minimum design rules for some process architectures can further limit the area footprint available for forming the gate contacts. As a result, forming the gate contacts on the device channel can lead to interference with neighbouring gate, source and/or drain contacts, resulting in defects, e.g., shadowing and shorting defects. Furthermore, small shifts in patterning during fabrication of these device features can be difficult to avoid, thereby further exacerbating the problem.

Due to these and other challenges associated with fabrication of semiconductor circuits, as can be seen in FIGS. 1A and 1B, in some fabrication processes, gate contacts are only formed between adjacent device channels. Furthermore, to avoid interference with neighboring gates, in some fabrication processes, one neighbouring gate of a gate contact may be fabricated as a non-contacted gate, i.e. an electrically non-functional gate. These strict circuit design rules greatly limit the cell routing flexibility, which is a problem that becomes increasing relevant as scaling advances.

There is thus a need for improved methods for forming gate contacts, allowing them to be formed in the device channels.

SUMMARY OF CERTAIN INVENTIVE ASPECTS

It is an object of the present invention to provide good methods for aligning gate contacts.

The above objective is accomplished by a method and two structures according to the present invention.

It is an advantage of embodiments of the present invention that gate contacts may be self-aligned to gate spacers, thereby obtaining a gate contact placement with minimal shift while ensuring electrical isolation between the gate contact and neighbouring active contacts e.g. source to gate and drain to gate isolation.

It is an advantage of embodiments of the present invention that the methods for creating self-aligned gate contacts may be combined with methods for creating self-aligned active area contacts.

It is an advantage of embodiments of the present invention that these methods are compatible with the use of sacrificial gate stacks and sacrificial active area electrodes, which can be replaced by self-aligned functional gate stacks and active area electrodes prior to their respective cap formation.

It is an advantage of embodiments of the present invention that both the gate electrode and active area electrodes source electrode, drain electrode may be cut by a dielectric material and that the patterning for these cuts can be performed separately and selectively for both types of electrodes; thereby allowing the employed masks to have oversized features, compared to the electrode width, making it easier to perform the patterning.

It is a further advantage of embodiments of the present invention that two circuit design rules can be relaxed: gate contacts are now allowed in the device channels and a gate contact must no longer be neighboured by a non-contacted gate.

It is a further advantage of embodiment of the present invention that a complete mask-layer can be optimized away, as it is sufficient to form a single gate contact between the gate stack and the corresponding contact line.

In a first aspect, the present invention relates to a method for forming one or more self-aligned gate contacts in a semiconductor device. The method comprises providing a substrate with at least one gate stack comprising a gate dielectric and a gate electrode, over an active region in or on the substrate, and spacer material coating lateral sides of the at least one gate stack. The method further comprises selectively recessing the gate electrode of the at least one gate stack with respect to the spacer material, thereby creating a first set of recess cavities; filling the first set of recess cavities with a dielectric material gate cap; etching at least one via above the at least one gate stack, through the dielectric material gate cap, selectively with respect to the spacer material, thereby exposing the gate electrode; and forming, in the at least one via, a gate contact electrically connecting the gate electrode.

In a method according to embodiments of the present invention, providing a substrate with at least one gate stack and spacer material coating lateral sides of the at least one gate stack may comprise providing a substrate with at least one sacrificial gate stack; coating lateral sides of the at least one sacrificial gate stack with spacer material; removing the at least one sacrificial gate stack, thus forming at least one gate cavity; and filling the at least one gate cavity with a replacement gate stack.

A method according to embodiments of the present invention may furthermore comprise cutting the at least one gate stack by a further dielectric material.

A method according to embodiments of the present invention may furthermore comprise providing active area electrodes aside the at least one coated gate stack. Such method may include providing a plurality of neighbouring gate stacks, wherein providing active area electrodes comprises filling gaps between the neighbouring gate stacks.

In a method according to embodiments of the present invention, providing active area electrodes may comprise providing conductive material contacting the active areas. Alternatively, providing active area electrodes may comprise first providing dielectric material at the contact areas; then opening the dielectric material; and then filling the openings with conductive material.

A method according to embodiments of the present invention may furthermore comprise selectively recessing the active area electrode with respect to the spacer material, thereby creating a second set of recess cavities; filling the second set of recess cavities with a dielectric material active area cap; etching at least one via above the active area, through the dielectric active area cap, selectively with respect to the spacer material, thereby exposing the active area electrode; and forming an active area contact electrically connecting the active area electrode.

In a method according to embodiments of the present invention, a mask may be provided prior to opening the dielectric material at the contact areas and may be subsequently removed after opening the dielectric material, allowing the opening of the dielectric material to be limited to subsections of the dielectric material.

The method according to embodiments of the present invention may furthermore comprise, after filling the first set of recess cavities with a dielectric material gate cap, covering the structure by one or more electrically insulating layers, in such a way that etching at least one via above the at least one gate stack comprises etching through the electrically insulating layer and through the dielectric material gate cap. The method may furthermore comprise, after forming at least one gate contact, forming at least one line of electrically conductive material in the one or more electrically insulating layers, and electrically contacting the at least one gate contact 560.

In a method according to embodiments of the present invention, covering the structure by one or more electrically insulating layers may include applying an etch stop layer.

In a method according to embodiments of the present invention, covering the structure by one or more electrically insulating layers may include applying a low-κ layer.

In a second aspect, the present invention relates to a semiconductor device, comprising a substrate with at least one gate stack comprising a gate dielectric and a gate electrode over an active region in or on the substrate, and spacer material coating lateral sides of the at least one gate stack; a dielectric material gate cap on top of the at least one gate stack; and at least one gate contact in a via through the dielectric material gate cap, the at least one gate contact being self-aligned with respect to the at least one gate stack by means of the spacer material.

A semiconductor device according to embodiments of the present invention may furthermore comprise at least one active area electrode aside the at least one coated gate stack. Such semiconductor device may furthermore comprise an active area contact in a via through dielectric material on top of the active area electrode, the active area contact being self-aligned with respect to the active area electrode by means of the spacer material.

A semiconductor device according to embodiments of the present invention may comprise a plurality of neighbouring gate stacks, wherein at least one of the active area electrodes may be located in between two neighbouring gate stacks.

A semiconductor device according to embodiments of the present invention may furthermore comprise dielectric material cutting the at least one gate stack over portions of its length.

A semiconductor device according to embodiments of the present invention may furthermore comprise at least one line of electrically conductive material electrically contacting the at least one gate contact.

A semiconductor device according to embodiments of the present invention may furthermore comprise at least one line of electrically conductive material electrically contacting the active area contact.

Particular and preferred aspects of the invention are set out in the accompanying independent and dependent claims. Features from the dependent claims may be combined with features of the independent claims and with features of other dependent claims as appropriate and not merely as explicitly set out in the claims.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference Figures quoted below refer to the attached drawings.

Figure 1A:
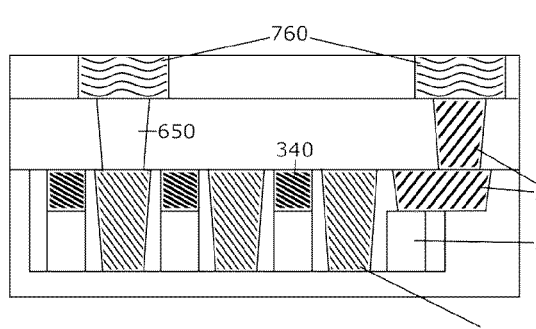
FIG. 1A is a side view of electrical connections to gates and active areas in a semiconductor device.
Figure 1B:
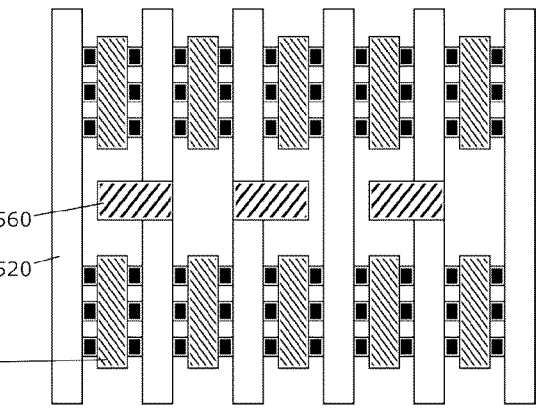
FIG. 1B is a top view of electrical contacts to gates and active areas in a semiconductor device.

In the different figures, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the invention.

As used herein, when a first material is said to be etched or recessed selectively with respect to a second material, this means that the first material is etched or recessed faster than the second material. Preferably, the etching or recessing process would etch or recess the first material at least twice faster, or more preferably at least five times faster, yet more preferably at least 10 times faster, than the second material.

In a first aspect, the disclosed technology relates to a method of forming one or more self-aligned gate contacts 560 in a semiconductor device.

The method of the first aspect comprises providing a substrate 100 with at least one gate stack 520 comprising a gate dielectric 420 and a gate electrode 550, over an active region in or on the substrate 100, and a spacer material 320 coating lateral sides of the at least one gate stack 520.

As used herein, an active region refers to a region which comprises active areas 600 that play an active role in the functioning of a semiconductor device. For example in a semiconductor substrate having formed therein or thereon a field effect transistor, an active region typically refers to a substrate area having formed therein or thereon various sub-features of the field effect transistor, including, e.g., a source, a drain and a channel connecting the source and the drain. The gate stack 520 is located over the active region and typically covers a portion thereof. The gate stack 520 may, for example, cover at least a portion of the channel in a field effect transistor. The gate dielectric 420 is typically located between the gate electrode 550 and the active region and prevents a direct electrical contact therebetween. The spacer material 320 is typically an electrically insulating material which shields the gate electrode 550 from electrical contact along the lateral sides.

The method of the second aspect additionally comprises: selectively recessing the gate electrode 550 of the at least one gate stack 520 with respect to the spacer material 320, thereby creating a first set of recess cavities; filling the first set of recess cavities with a dielectric material gate cap 340; etching at least one via 920 above the at least one gate stack 520, through the dielectric material gate cap 340, selectively with respect to the spacer material 320, thereby exposing the gate electrode 550; and forming, in the at least one via 920, a gate contact 560 electrically connecting the gate electrode 550.

In various embodiments, recessing the gate electrode 550 includes etching a top portion of the gate electrode 550. In some embodiments, exposing the gate electrode 550 may comprise completely removing the overlaying material above a portion of the gate electrode 550, thereby physically exposing the gate electrode 550 over the portion. In other embodiments, exposing the gate electrode 550 may comprise only partially removing the overlaying material above a portion of the gate electrode 550, such that the later formed gate contact 560 electrically connects to the gate electrode 550 by means of a tunnel current, while leaving the portion of the gate electrode 550 physically covered. Forming a gate contact 560 typically comprises filling the at least one via 920 with a conductive material 740, 750.

In embodiments, etching, recessing, filling and forming step may additionally comprise a planarization step, such as a chemical-mechanical planarization (CMP) step. A planarization step advantageously allows any overburden to be removed and allows the semiconductor device to have a level top surface, facilitating further processing steps.

Figure 2A:
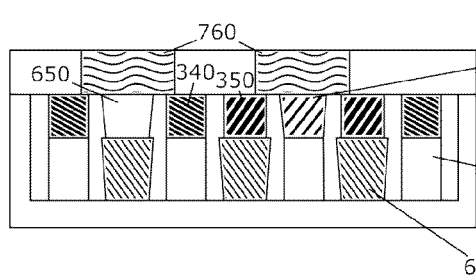
FIG. 2A is a side view of electrical contacts to gates and active areas in a semiconductor device, according to embodiments of the disclosed technology.
Figure 2B:
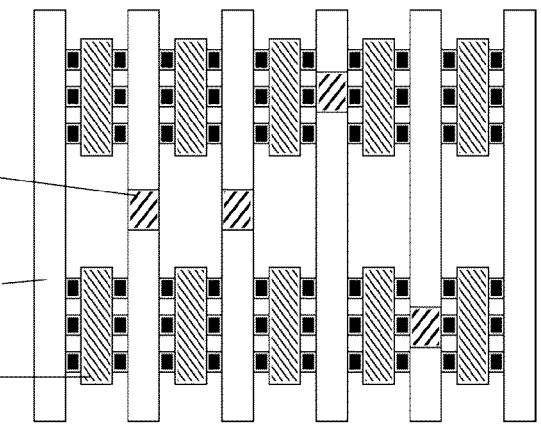
FIG. 2B is a top view of electrical contacts to gates and active areas in a semiconductor device, according to embodiments of the disclosed technology.

Referring to FIGS. 2A and 2B, by forming a cap on top of the gate electrodes 550 and subsequently selectively etching the at least one via 920 with respect to the spacer material 320, the via 920 is advantageously self-aligned to the spacer material 320. This self-alignment advantageously leads to a gate contact 560 placement with minimal shift, while ensuring electrical isolation from neighbouring contacts. In turn, such a gate contact 560 placement advantageously allows the gate contacts 560 to be formed within the device channel.

In embodiments of the disclosed technology, providing a substrate 100 with at least one gate stack 520 and spacer material 320 coating lateral sides of the at least one gate stack 520 may comprise: providing a substrate 100 with at least one sacrificial gate stack 510; coating lateral sides of the at least one sacrificial gate stack 510 with spacer material 320; removing the at least one sacrificial gate stack 510, thus forming at least one gate cavity; and filling the at least one gate cavity with a replacement gate stack 520.

In embodiments, coating the lateral sides of the at least one sacrificial gate stack 510 with spacer material 320 may comprise coating both the lateral and top side of the at least one sacrificial gate stack 510 and subsequently removing the top coating. The top coating may for example be removed as part of a planarization step.

A gate stack 520 may be obtained by making use of a sacrificial gate stack 510, which is later replaced by the actual, functional gate stack 520. This approach advantageously affords an easy way to make an actual gate stack 520 comprising a plurality of individual layers of material. The gate stack 520 may for example comprise a layer of gate dielectric 420, such as a high-K dielectric, a layer of work function adjustment metal 530 and a fill metal 540.

In embodiments of the disclosed technology, the method may furthermore comprise cutting, or replacing portions of, the at least one gate stack 520 by a further dielectric material 330.

Cutting a gate stack 520 advantageously allows one gate stack 520 to be split into a plurality of gate stacks 520. In preferred embodiments, cutting the gate stack 520 may be performed after providing the spacer material 320. This may be referred to in the art as a 'late gate cut'. In some of these embodiments, cutting the gate stack 520 may be performed selectively with respect to the spacer material 320. Cutting the gate stack 520 selectively with respect to the spacer material 320 advantageously ensures that the gate stack 520 does not short to a neighbouring gate stack 520. In other embodiments, cutting the gate stack 520 may be performed before providing the spacer material 320. Furthermore, in embodiments wherein a sacrificial gate stack 510 is replaced by a gate stack 520, cutting the gate stack 520 may comprise cutting the sacrificial gate stack 510, thereby obtaining a cut gate stack 520 after replacement.

In embodiments of the disclosed technology, the method may furthermore comprise providing active area electrodes 620 aside the at least one coated gate stack 520.

In embodiments of the disclosed technology, the method may include providing a plurality of neighbouring gate stacks 520, wherein providing active area electrodes 620 may comprise filling gaps between the neighbouring gate stacks 520.

In embodiments of the disclosed technology, providing active area electrodes 620 may comprise providing conductive material 630, 640 contacting the active areas 600.

In embodiments of the disclosed technology, providing active area electrodes 620 may comprise first providing dielectric material 610 at the contact areas, then opening the dielectric material 610, and then filling the openings with conductive material 630, 640.

Active area electrodes 620 advantageously allow active areas 600 in the active region to be electrically operated. For example in a field effect transistor, active area electrodes 620 to the source and drain may be provided.

In embodiments of the disclosed technology, the method may furthermore comprise: selectively recessing the active area electrode 620 with respect to the spacer material 320, thereby creating a second set of recess cavities; filling the second set of recess cavities with a dielectric material active area cap 350; etching at least one via 920 above the active area, through the dielectric active area cap 350, selectively with respect to the spacer material 320, thereby exposing the active area electrode 620; forming an active area contact 650 electrically connecting the active area electrode 620.

In some embodiments, the dielectric material gate cap 340 and the dielectric material active area cap 350 may be, but do not need to be, made of the same material. Different materials selective materials may have benefits, but have the disadvantage that more masks are needed during processing.

In preferred embodiments, the gate contact 560 and active area contact 650 may be made of the same material.

Similarly to the gate electrodes 550, by forming a cap on top of the active area electrodes 620 and subsequently selectively etching the at least one via 920 with respect to the spacer material 320, the via 920 is advantageously self-aligned to the spacer material 320. A contact formed in this self-aligned via 920 advantageously displays a minimal shift in its placement, while ensuring electrical isolation from neighbouring contacts.

In embodiments of the disclosed technology, a mask may be provided prior to opening the dielectric material 610 at the contact areas and is subsequently removed after opening the dielectric material 610, allowing the opening of the dielectric material 610 to be limited to subsections of the dielectric material 610.

Similarly to cutting the gate stacks 520, opening the dielectric material 610 over subsections advantageously allows a plurality of electrically disconnected active area electrodes 620 to be formed. These active area electrodes 620 can advantageously each be contacted separately without interfering with one another.

In embodiments of the disclosed technology, the method may furthermore comprise, after filling the first and second set of recess cavities simultaneously or not with a dielectric material gate cap 340, covering the structure by one or more electrically insulating layers 710, 720, 730, in such a way that etching at least one via 920 above the at least one gate stack 520 comprises etching through the electrically insulating layer 710, 720, 730 and through the dielectric material gate cap 340.

In embodiments of the disclosed technology, the method may furthermore comprise, after forming at least one gate contact 560, forming at least one first line 760 gate line of electrically conductive material 740, 750 in the one or more electrically insulating layers 710, 720, 730, electrically contacting the at least one gate contact 560.

In embodiments, the method may furthermore comprise, after forming at least one active area contact 650, forming at least one second line 760 active area line of electrically conductive material 740, 750 in the one or more electrically insulting layers 710, 720, 730, electrically contacting the at least one active area contact 650.

In preferred embodiments, at least one trench 910 is etched within at least a top portion of the one or more electrically insulating layers 710, 720, 730 and forming the at least one second line 760 comprises forming the at least one second line 760 within the trench 910.

In preferred embodiments, the first line and/or second line 760 may be made of the same material as the gate contact 560 and/or active area contact 650.

In preferred embodiments, forming gate contacts 560, forming active area contacts 650 and forming first and/or second lines 760 may comprise filling, in a single step, the vias 920 and trenches 910 with a conductive material 740, 750.

Covering the structure, after filling the recess cavities, by one or more electrically insulating layers 710, 720, 730 advantageously allows lines 760 to be provided above the one or more insulating layers which are isolated from the gate electrodes 550 and/or the active area electrodes 620. These lines 760 may be connected to these gate electrodes 550 and/or active area electrodes 620 by contacting with their respective contacts 560, 650. This may, for example, be achieved by forming the one or more contacts 560, 650 and lines 760 by filling the one or more vias 920 and trenches 910 with a conductive material 740, 750, as part of a single step.

In embodiments of the disclosed technology, covering the structure by one or more electrically insulating layers 710, 720, 730 may include applying an etch stop layer 710.

An etch stop layer 710 is a layer that is sufficiently not etched under some selected etching conditions. The use of an etch stop layer 710 advantageously protects the underlying structure from being etched when using these etching conditions. For example, the etch stop layer 710 may be etched when etching the one or more vias 920 in a first etching, but may not be etched when etching the one or more trenches 910 in a second etching. This allows the lines 760 to only connect to gate contacts 560 and/or active area contacts 650, by protecting the gate caps 340 and/or active area caps 350 where no vias 920 were etched.

In embodiments of the disclosed technology, covering the structure by one or more electrically insulating layers 710, 720, 730 may include applying a low-κ layer 720.

A low-κ dielectric layer 720 advantageously provides a good electrical insulation.

In a second aspect, the disclosed technology relates to a semiconductor device, comprising:
a substrate 100 with at least one gate stack 520 comprising a gate dielectric 420 and a gate electrode 550, over an active region in or on the substrate 100, and spacer material 320 coating lateral sides of the at least one gate stack 520;
a dielectric material gate cap 340 on top of the at least one gate stack 520;
at least one gate contact 560 in a via 920 through the dielectric material gate cap 340, the at least one gate contact 560 being self-aligned with respect to the at least one gate stack 520 by means of the spacer material 320.

In embodiments of the disclosed technology, the semiconductor device may furthermore comprise at least one active area electrode 620 aside the at least one coated gate stack 520.

In embodiments of the disclosed technology, the semiconductor device may furthermore comprise an active area contact 650 in a via 920 through dielectric material 350 on top of the active area electrode 620, the active area contact 650 being self-aligned with respect to the active area electrode 620 by means of the spacer material 320.

In embodiments of the disclosed technology, the semiconductor device may comprise a plurality of neighbouring gate stacks 520, wherein at least one of the active area electrodes 620 is located in between two neighbouring gate stacks 520.

In embodiments of the disclosed technology, the semiconductor device may furthermore comprise dielectric material 330 cutting the at least one gate stack 520 over portions of its length.

In embodiments of the disclosed technology, the semiconductor device may furthermore comprise at least one first line 760 of electrically conductive material 740, 750 electrically contacting the at least one gate contact 560.

In embodiments of the disclosed technology, the semiconductor device may furthermore comprise at least one second line 760 of electrically conductive material 740, 750 electrically contacting the active area contact 650.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

Reference will be made to transistors. These are three-terminal devices having a first main electrode such as a drain, a second main electrode such as a source and a control electrode such as a gate for controlling the flow of electrical charges between the first and second main electrodes.

EXAMPLE

Formation of Self-Aligned Gate Contacts and Active Contacts in a FinFET

FIGS. 3-15 illustrate intermediate structures at various stages of forming electrical contacts to gates, according to embodiments of the disclosed technology. In particular, the intermediate structures illustrate forming electrical contacts to gates of FinFETs.

Figure 3:
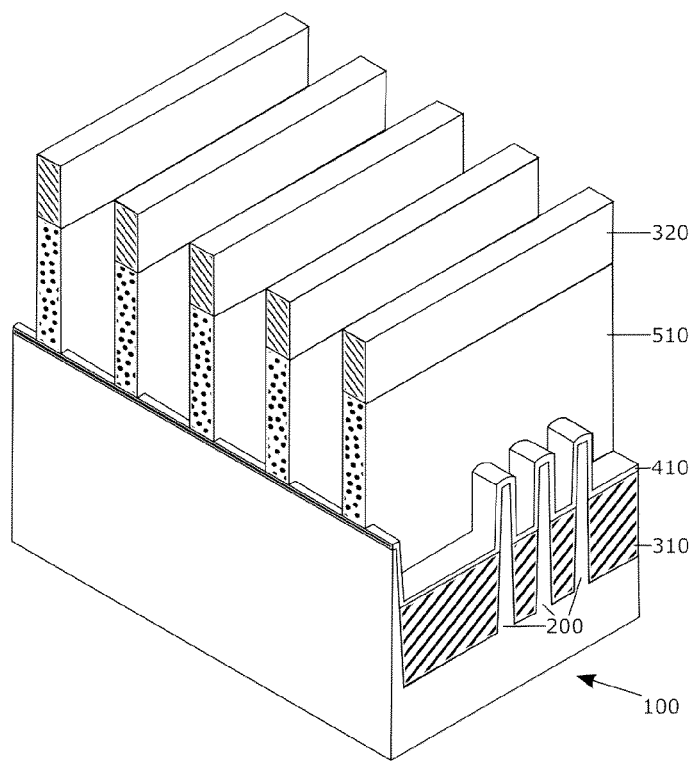
FIGS. 3-15 illustrate intermediate structures at various stages of forming electrical contacts to gates, according to embodiments of the disclosed technology.

Referring to FIG. 3, a substrate 100 is provided, comprising, e.g., a Si substrate having formed thereon a plurality of fins 200, a plurality of shallow trench isolation layers (STI) 310, a sacrificial gate stack 410, e.g., an oxide, covering the fins 200 and the STI layers 310, and polysilicon sacrificial gate stacks 510 placed perpendicular over the fins 200. The sacrificial gate stacks 510 are topped by a spacer material 320 formed of, e.g., $Si_3N_4$.

Figure 4:
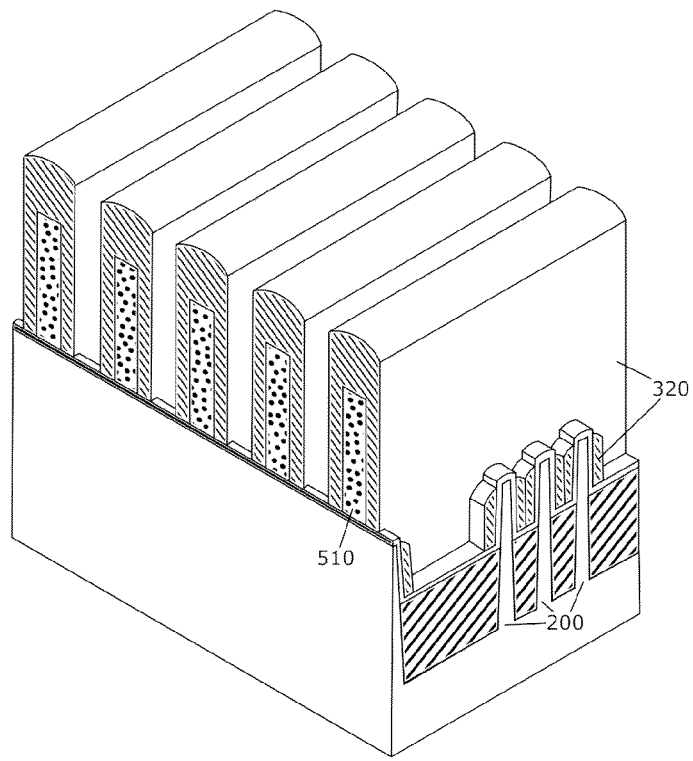

Reference is now made to FIG. 4. The sacrificial gate stacks 510 and fins 200 are further coated with a spacer material 320, formed of, e.g., $Si_3N_4$.

Figure 5:
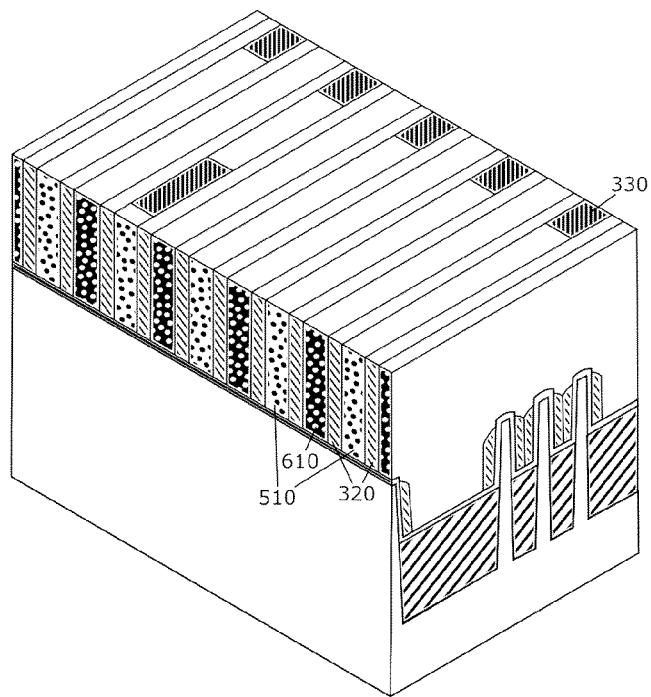

With reference to FIG. 5, the space between the spacer-coated sacrificial gate stacks 510 is filled with a dielectric material 610, formed of, e.g., $SiO_2$, and the structure is subsequently planarized, stopping at the top of the sacrificial gate stacks 510. The sacrificial gate stacks 510 are subsequently cut or recessed selectively with respect to the spacer material, to allow a line 760 to electrically connect to a cut gate with low risk of shorting to a neighbouring gate. To this end, a mask layer not shown is applied over the structure and a cut-design is lithographically defined in the mask-layer. The sacrificial gate stack 510 is subsequently etched where the recessed mask is open. The etch process, e.g. a bromine-based etching, is designed to be selective towards the polysilicon sacrificial gate stack material 510, with respect to both the $SiO_2$ dielectric material 610 and the $Si_3N_4$ spacer material 320. This added selectively allows the critical dimensions and overlay design rules to be reduced, in turn allowing a mask to be used which is oversized beyond the actual sacrificial gate stacks 510. In some embodiments, the recesses are filled with a dielectric material 330 different than and having an etch selectivity against the dielectric material 610 and the spacer material 320, e.g., silicon oxycarbide SiOC. Subsequently, the overburden above the $SiO_2$ dielectric material 610 and sacrificial gate stack 510 level is removed in a planarization step.

Figure 6:
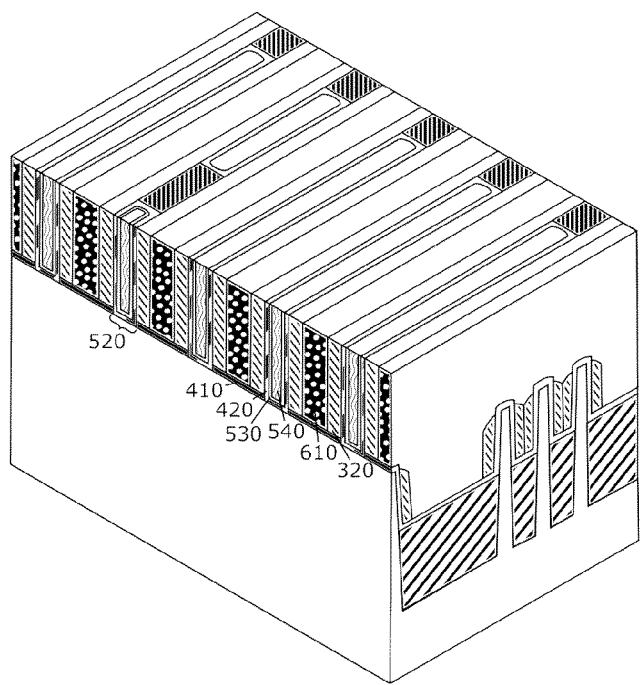

Reference is now made to FIG. 6. The sacrificial gate stacks 510 are replaced by replacement gate stacks 520 in multiple steps. First the sacrificial gate stack 510 and sacrificial gate stack oxide 410 are selectively etched away using an etchant, e.g. a wet etchant such as tetramethylammonium hydroxide (TMAH), which selectively etches the sacrificial gate stack 510 against the $Si_3N_4$ spacer material 320 and the $SiO_2$ dielectric material 610. Subsequently, a layer of high-κ gate dielectric 420, e.g. $HfO_2$, and a layer of work function adjustment metal 530, e.g. TiN, are deposited. Finally the remaining trenches are filled with a fill metal 540, e.g. W, forming the gate electrode 550, and any overburden is removed through a chemical-mechanical planarization (CMP).

Figure 7:
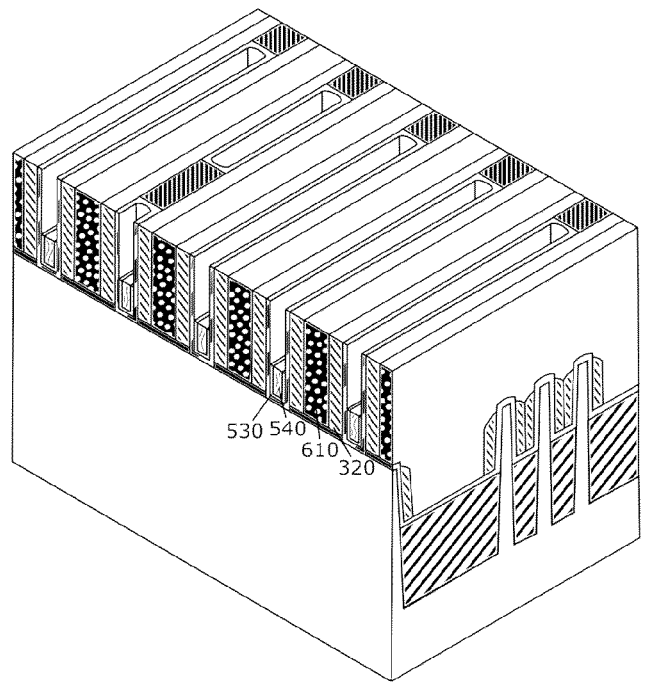

Referring to FIG. 7, all conductive parts of the gate stack 520, including, e.g., the work function adjustment metal 530 and the fill metal 540, are recessed by a dry or wet etch process, e.g. a $SF_6$ based plasma etching, selectively with respect to the $SiO_2$ dielectric material 610 and the $Si_3N_4$ spacer material 320. There is a similar etch rate between the work function adjustment metal 530 and the fill metal 540.

Figure 8:
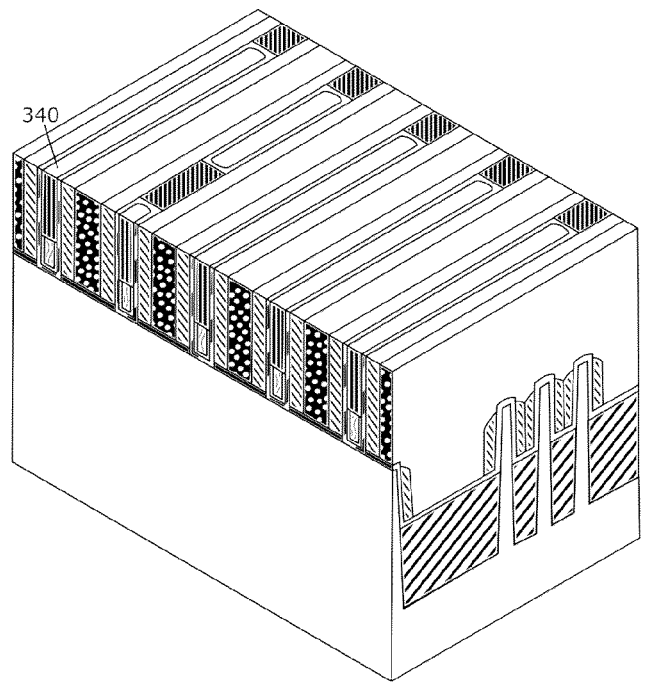

Referring to FIG. 8, the recess cavity is filled with a SiOC dielectric gate cap 340 and the overburden is removed.

Figure 9:
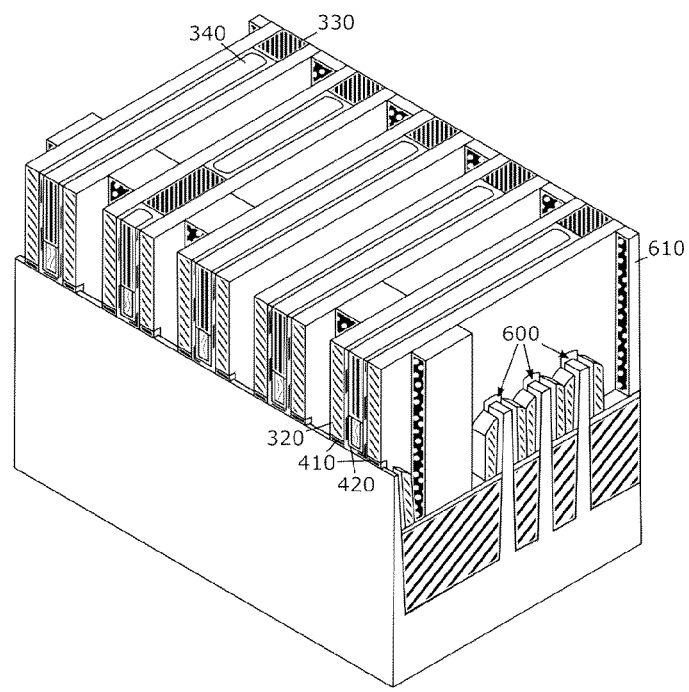

Referring to FIG. 9, the $SiO_2$ dielectric material 610 and sacrificial gate stack oxide 410 are etched. e.g. dry-etched using, e.g., a high polymerization rate fluorocarbon based plasma etching, selectively with respect to the $Si_3N_4$ spacer material 320, the $HfO_2$ high-κ gate dielectric 420 and the SiOC dielectric caps 330, 340, forming trenches and exposing the source and drain active areas 600. In order to isolate non-related active areas 600 (e.g. n-p or abutted cells) from each other, the etching is only performed over subsections of the $SiO_2$ dielectric material 610, by performing the etching through an intermediate mask layer not shown with a suitable trench contact pattern. The pattern in the intermediate mask layer can be obtained through a lithographic process which can print the required feature size in a single exposure (e.g. electron beam or extreme UV lithography), or by a multi patterning process (e.g. double lithography-double etch, lithography-lithography-freeze, self-aligned double patterning or quadruple patterning). Through the selectivity of the etching process, the intermediate image is again not limited to the, in this case, size of the active areas 600 only and the image may instead extend over the gate region as well; the isolation between the gate electrode 550 and the active area electrode 620 will be guaranteed by the $Si_3N_4$ spacer material 320.

Figure 10:
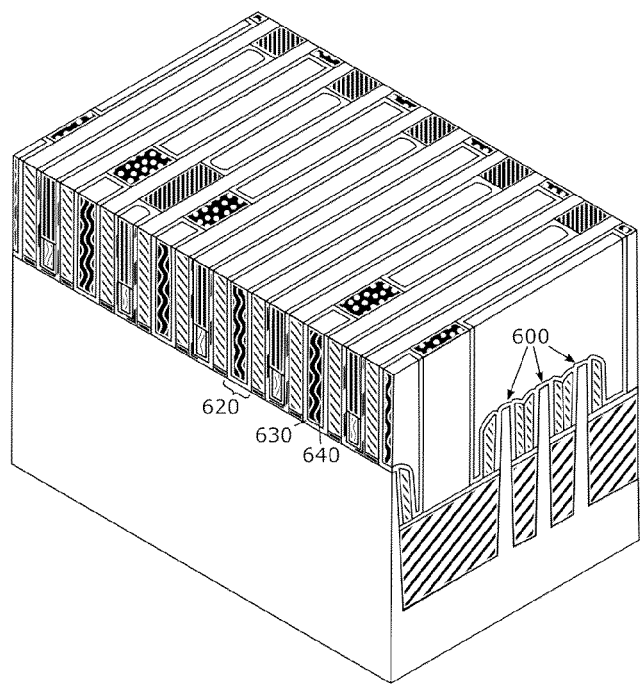

Referring to FIG. 10, active area electrodes 620, making electrical contact to the source and drain active areas 600 are formed through a silicide, direct contact or MIS contact method. A metal barrier 630 such as TiN or WN is deposited and the trench is subsequently filled with tungsten 640. Subsequently the overburden may be removed by a CMP process.

Figure 11:
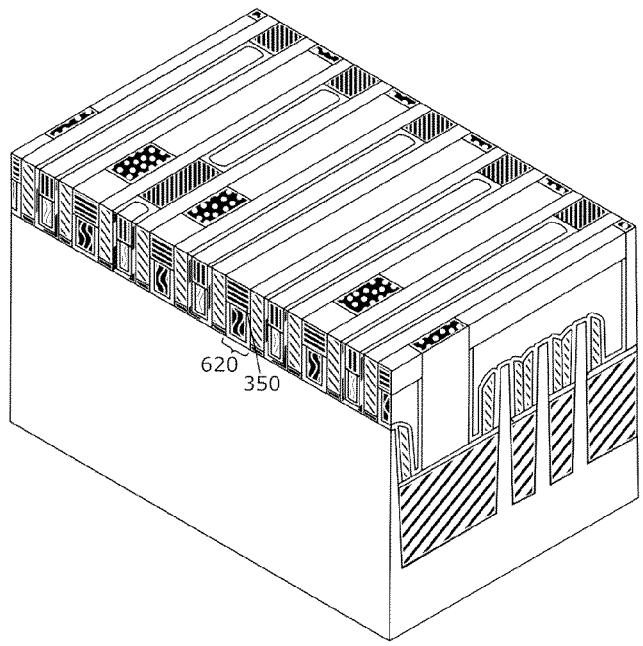

Referring to FIG. 11, the active area electrodes 620 are recessed, the resulting cavity is filled with a SiOC active area cap 350. Subsequently. the overburden may be removed by a CMP process.

Figure 12:
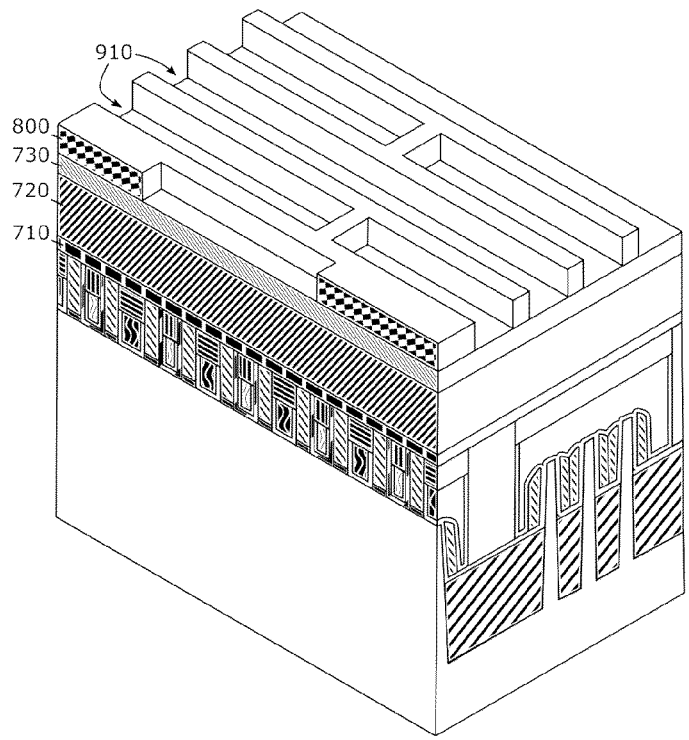

Referring to FIG. 12, the intermediate metal level 700 is formed by a trench-first-metal-hardmask dual-damascene process. To that end, an etch stop layer 710, e.g., a silicon carbonitride (SiCN) layer, a low-κ dielectric 720 such as SiOC or porous organosilicate glass, and an oxide layer 730 such as $SiO_2$ are deposited. Subsequently, a hardmask 800, such as a TiN hardmask, is deposited on top and the trenches 910 corresponding to the intermediate metal level 700 are patterned into the hardmask 800.

Figure 13:
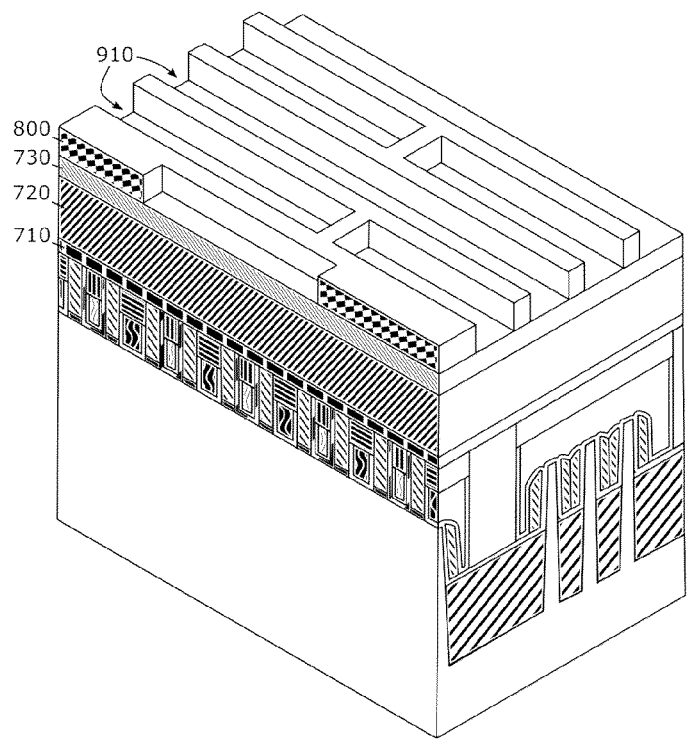

Referring to FIG. 13, vias 920 are etched through the oxide 730, low-κ dielectric 720, and etch stop layer 710, while minimizing the attack to the spacer material 320. This can be achieved by either selecting an etch stop layer 710 which can be etched selectively with respect to the spacer material 320 or, more simply, by minimizing the overetch time after the etch stop layer 710 is opened.

Figure 14:
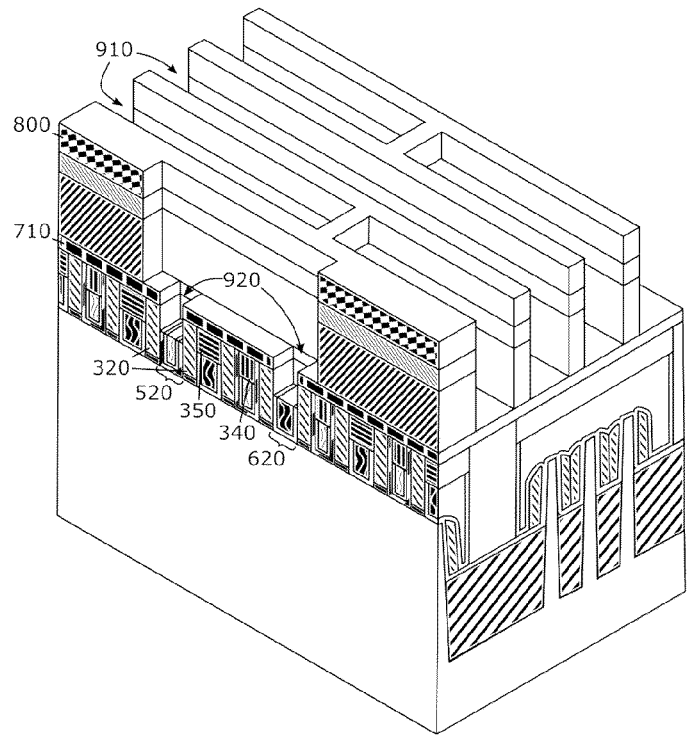

In the method step illustrated in FIG. 14, the trenches 910 in the hardmask 800 are etched down to the etch stop layer 710, leaving the etch stop layer 710 in place. The vias 920 are etched through the SiOC gate caps 340 and active area caps 350 a thereby exposing the gate stacks 520 and active area electrodes 620. The etching of the vias 920 is performed selectivity with respect to the spacer material 320 and the etch stop layer 710; where the selectivity towards the spacer material 320 ensures the isolation distance between the gate and active area contacts 650, while the selectivity towards the etch stop layer 710 ensures the isolation distance between the intermediate metal layer 700 on the one hand, and the gate stacks 520 and active area electrodes 620 on the other.

Figure 15:
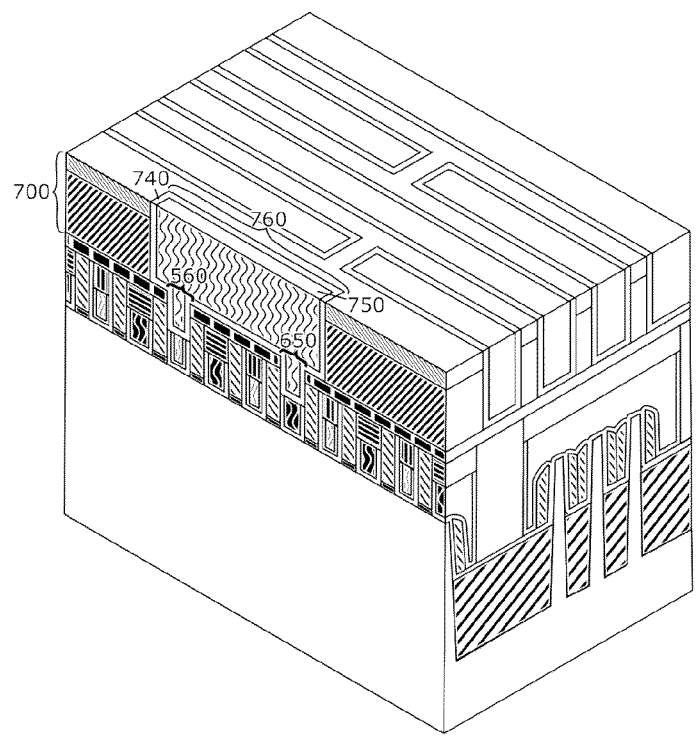

In the method step illustrated in FIG. 15, the trench-first-metal-hardmask dual-damascene process for forming the intermediate metal level 700 is finalized by depositing a metal barrier 740 and filling the vias 920 and trenches 910 with a Cu fill metal 750, thereby respectively obtaining the gate and active area contacts 560, 650 and lines 760. The hardmask can be removed before or after the filling step. Removing it before the filling step is better for the actual filling, but finding the right etch chemistries might prove difficult. Removing it after filling may be done for instance by means of classical CMP.

It is to be understood that although preferred embodiments, specific constructions and configurations, as well as materials, have been discussed herein for devices according to the present invention, various changes or modifications in form and detail may be made without departing from the scope and spirit of this invention. For example, any formulas given above are merely representative of procedures that may be used. Functionality may be added or deleted from the block diagrams and operations may be interchanged among functional blocks. Steps may be added or deleted to methods described within the scope of the present invention.

What is claimed is:

1. A method of forming one or more self-aligned gate contacts in a semiconductor device, the method comprising:
   providing a substrate having formed thereon at least one gate stack extending in a first lateral direction, the gate stack comprising a gate dielectric and a gate electrode formed over an active region in or on the substrate, the substrate further having formed thereon a spacer material coating sides of the at least one gate stack opposing each other in a second lateral direction crossing the first lateral direction;
   selectively recessing the gate electrode of the at least one gate stack against the spacer material, thereby creating a first set of recess cavities;
   filling the first set of recess cavities with a dielectric material gate cap;
   etching at least one via above the at least one gate stack and through the dielectric material gate cap, wherein selectively recessing the gate electrode and etching the at least one via comprise selectively etching against the same spacer material, thereby exposing the gate electrode;
   forming, in the at least one via, a gate contact electrically connecting the gate electrode; and removing a lateral portion of the at least one gate stack to separate the at least one gate stack in the first lateral direction and replacing the removed lateral portion with a dielectric material different from the spacer material.

2. The method according to claim 1, wherein providing the substrate comprises:
   providing the substrate having at least one sacrificial gate stack;
   coating sides of the at least one sacrificial gate stack opposing each other in the second lateral direction with the spacer material;
   removing the at least one sacrificial gate stack, thereby forming at least one gate cavity; and
   filling the at least one gate cavity with a replacement gate stack.

3. The method according to claim 2, further comprising providing active area electrodes aside the at least one gate stack coated with the spacer material.

4. The method according to claim 3, the method including providing a plurality of neighboring gate stacks, wherein providing the active area electrodes comprises filling gaps between the neighboring gate stacks.

5. The method according to claim 3, wherein providing the active area electrodes comprises providing a conductive material contacting active areas.

6. The method according to claim 3, wherein providing the active area electrodes comprises:
   providing a dielectric material at contact areas;
   forming openings in the dielectric material; and
   filling the openings with a conductive material.

7. The method according to claim 6, furthermore comprising:
   selectively recessing the active area electrodes with respect to the spacer material, thereby creating a second set of recess cavities;
   filling the second set of recess cavities with a dielectric material active area cap;
   etching at least one via above the active area, through the dielectric active area cap, selectively with respect to the spacer material, thereby exposing the active area electrode; and
   forming an active area contact electrically connecting the active area electrode.

8. The method according to claim 7, wherein a mask is provided prior to forming the openings in the dielectric material at the contact areas and is subsequently removed after forming the openings in the dielectric material, thereby allowing the openings in the dielectric material to be limited to subsections of the dielectric material.

9. The method according to claim 1, further comprising, after filling the first set of recess cavities with the dielectric material gate cap, covering the substrate with one or more electrically insulating layers, such that etching the at least one via above the at least one gate stack comprises etching through the one or more electrically insulating layers and through the dielectric material gate cap.

10. The method according to claim 9, further comprising, forming at least one gate contact in the at least one via, and forming at least one line of electrically conductive material in the one or more electrically insulating layers electrically contacting the at least one gate contact.

11. The method according to claim 10, wherein covering the substrate with one or more electrically insulating layers includes applying an etch stop layer.

12. The method according to claim 11, wherein covering the substrate with the one or more electrically insulating layers includes applying a low-K layer.

13. The method of claim 1, wherein during etching the at least one via through the dielectric material gate cap, a top surface of the spacer material or an etch stop layer on the top surface of the spacer material is exposed.

* * * * *